United States Patent
Wang et al.

(10) Patent No.: US 11,892,223 B2
(45) Date of Patent: Feb. 6, 2024

(54) TWO-PHASE IMMERSION COOLING DEVICE

(71) Applicant: Fulian Precision Electronics (Tianjin) Co., LTD., Tianjin (CN)

(72) Inventors: Chun Wang, Houston, TX (US); Warm-Horng Yuan, Houston, TX (US)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 115 days.

(21) Appl. No.: 17/582,497

(22) Filed: Jan. 24, 2022

(65) Prior Publication Data
US 2023/0045342 A1  Feb. 9, 2023

Related U.S. Application Data

(60) Provisional application No. 63/230,028, filed on Aug. 5, 2021.

(51) Int. Cl.
*F25D 11/02* (2006.01)
*F25D 17/06* (2006.01)

(52) U.S. Cl.
CPC .............. *F25D 11/02* (2013.01); *F25D 17/06* (2013.01)

(58) Field of Classification Search
CPC .... H05K 7/203; H05K 7/20818; F25B 23/00; F28F 3/12; F28D 2021/0029; F28D 1/0206; F25D 17/06
See application file for complete search history.

(56) References Cited

U.S. PATENT DOCUMENTS

| | | | | |
|---|---|---|---|---|
| 5,099,908 | A * | 3/1992 | Taraci | G01R 31/2891 374/57 |
| 11,606,878 | B2 * | 3/2023 | Alissa | H05K 5/0056 |
| 2007/0193300 | A1 * | 8/2007 | Tilton | F25B 43/04 257/E23.088 |
| 2015/0060009 | A1 * | 3/2015 | Shelnutt | H05K 7/203 165/11.1 |
| 2019/0008077 | A1 * | 1/2019 | Ishinabe | H05K 7/20272 |
| 2023/0080447 | A1 * | 3/2023 | Shah | H05K 7/20836 361/679.53 |

* cited by examiner

*Primary Examiner* — Ana M Vazquez
(74) *Attorney, Agent, or Firm* — ScienBiziP, P.C.

(57) ABSTRACT

A two-phase immersion cooling device includes an upper box body, a lower box body, a plurality of heating elements, and a condenser. The walls of the upper box body form a first cavity. The lower box body defines a second cavity containing coolant. The heating elements are disposed in the second cavity and immersing in the coolant. The condenser in the upper box body includes multiple rows and columns of condensing tubes, is arranged across or along the upper box body to fill the first cavity. The lower box body is detachably and hermetically connected to the bottom of the upper box body, connecting the second cavity with the first cavity to form an accommodating cavity.

12 Claims, 4 Drawing Sheets

TWO-PHASE IMMERSION COOLING DEVICE

TECHNICAL FIELD

The present disclosure relates to temperature control, in particular to a two-phase immersion cooling device.

BACKGROUND

With the rapid improvement of power and heat flux density of computer chips, internet of things, batteries of new energy vehicles, electronic devices, home digital electrical equipment, digital medical treatment, chips and electronic devices of edge computing, quantum computing, and heat-generating components of mechanical or electronic equipment, the cooling technology has also experienced rapid development from generation to generation. After the continuous development of passive cooling, enhanced air cooling, thermosyphon loop heat pipe cooling, liquid cooling and submerged single-phase immersion cooling technology, two-phase immersion cooling method is one of the most effective server cooling technologies.

The existing two-phase immersion cooling device includes a box body, a plurality of heating elements, a coolant, a cover body and a condenser. The element generating heat is contained in the lower part of the box body and immersed in the coolant. Existing technology assembles the condenser in the cover body. However, the heat exchange area of the condenser is very limited and cannot meet the cooling requirements for high-power and high heat density heating elements. In order to overcome this deficiency, existing technology arranges the condenser along the inner wall of the box body to increase the heat exchange area of the condenser and cool the heating element with higher heat flux density. In such a configuration, the condenser is far away from the cavity surrounded by the plurality of the inner walls, so that the heating elements can pass through the cavity up and down, and the heating elements can be conveniently installed in the box body of the lower part or taken out from the box body of the lower part. However, since the interior of the upper part of the box body needs to reserve the cavity for the heating elements to pass through, space left for the condenser in the upper part of the box body becomes limited. As a result, the condenser accommodated in the box body of unit volume is small and the condensation capacity is limited. The existing two-phase immersion cooling device can only meet low cooling requirements of the heating elements. In order to meet greater cooling requirements of the heating elements (such as servers with high heat load in data centers), the solution is to increase the volume of the box body, such as increasing the height, length or width of the box body, so that the upper part of the box body has a larger volume along the wall to accommodate a larger condenser. However, as a result, the height of the immersion two-phase cooling device becomes higher, or the size becomes correspondingly larger, and the cost becomes higher. The function of the upper cavity with greater height and larger peripheral size is only for the unobstructed passage of the heating elements up and down. However, requirements for the space utilization of the mechanism also increase, and the cooling device of the heating elements is a product with more stringent space requirements, especially for the data center. There is a more urgent demand for the immersion two-phase cooling device with smaller floor area and higher capacity, and a simple, compact and low-cost structure is particularly important. Another technology arranges a condenser coil on the upper part of the box body. However, because the box is an integrated structure, it is difficult for the server to pass up and down through the upper cavity, and there is no condenser pipe in the middle part of the coil, which limits the heat exchange capacity of the condenser coil.

Therefore, improvement is desired.

SUMMARY OF THE INVENTION

The present disclosure provides a two-phase immersion cooling device capable of accommodating a condenser with a large condensing capacity in an upper box of unit volume.

The present disclosure provides a two-phase immersion cooling device, wherein the two-phase immersion cooling device includes an upper box body, a lower box body, a plurality of heating elements, and a condenser. The upper box body includes a first side wall, a second side wall, a third side wall, and a fourth side wall that are connected to each other from top to bottom, wherein the first side wall, the second side wall, the third side wall and the fourth side wall jointly form a first cavity. The lower box body defines a second cavity; and the second cavity is configured to contain coolant. A plurality of heating elements are disposed in the second cavity and immersed in the coolant. The condenser comprises multiple rows and multiple columns of condensing tubes; wherein each row and each column of the condensing tubes are arranged from the first side wall to the third side wall or from the second side wall to the fourth side wall, and upward from bottom of the upper box body to fill the first cavity, and wherein the lower box body is detachably and hermetically connected to the bottom of the upper box body, to connect the second cavity with the first cavity to form an accommodating cavity.

According to an embodiment of the present disclosure, the two-phase immersion cooling device further includes a fan, the fan is disposed in the accommodating cavity and located above or below the condenser.

According to an embodiment of the present disclosure, the two-phase immersion cooling device further includes a at least one sensor disposed in the accommodating cavity, the at least one sensor comprises at least one of a temperature sensor, a humidity sensor, a pressure sensor, and a liquid level sensor, at least one sensor is configured to sense at least one of the vapor temperature, liquid temperature, vapor humidity, vapor pressure, liquid level height of the coolant, inlet temperature and outlet temperature and flow rate of condenser coolant in the accommodating cavity.

According to an embodiment of the present disclosure, the two-phase immersion cooling device further includes a first double-faced socket hermetically arranged on the upper box body. The inner socket of the first double-faced socket is configured for electrical connection with the fan and the at least one sensor, and external socket of the first double-faced socket is configured for electrical connection with external connecting lines of the external power supply and the at least one sensor.

According to an embodiment of the present disclosure, the two-phase immersion cooling device also includes a liquid level sensor disposed on the lower box body, which is connected to the accommodating cavity and used to detect the liquid level height of the coolant.

According to an embodiment of the present disclosure, the two-phase immersion cooling device also includes a coolant management system, the coolant management system is used to replenish coolant into the accommodating cavity and filter impurities in the coolant.

According to an embodiment of the present disclosure, the coolant management system comprises an overflow weir plate, a liquid storage tank, a pump, a pipeline, a valve, and a filter. The pump, the pipeline, the valve, and the filter are in communication with the accommodating cavity outside or inside the box body.

According to an embodiment of the present disclosure, the two-phase immersion cooling device further includes a controller, the controller is electrically connected to at least one fan, at least one temperature sensor, at least one pressure sensor, at least one humidity sensor, at least one flow sensor, at least one condensing controller, at least one liquid level sensor, at least one safety valve controller, at least one coolant management system, at least one pressure balance valve controller and at least one alarm; at least one liquid level sensor is electrically connected to the at least one alarm and at least one coolant management system. When liquid level height of the coolant detected by the liquid level sensor is lower than a preset height, the controller controls the alarm to output an alarm, and controls the coolant management system to replenish the accommodating cavity with coolant.

According to an embodiment of the present disclosure, the two-phase immersion cooling device further includes a second double-faced socket hermetically arranged on the lower box body. The inner of the socket is connected to the external connecting lines of the heating elements, the temperature sensor, the liquid level management system, and the outer socket of the second double-faced socket is used for electrical connection with the external connecting lines of the heating elements, the temperature sensor and the liquid level management system.

According to an embodiment of the present disclosure, the lower box body is detachably connected with the upper box body through flange connection, hook connection, bite joint connection, clamp connection, or screw connection.

According to an embodiment of the present disclosure, the two-phase immersion cooling device further includes a cover body, the cover body is detachably connected to one end of the upper box body away from the lower box body, and the cover body covers the upper box body to seal the accommodating cavity.

According to an embodiment of the present disclosure, the two-phase immersion cooling device further includes an extracting valve disposed on the upper box body, the extracting valve is configured to connect with a vacuum device to extract non-condensable vapor in the accommodating cavity.

According to an embodiment of the present disclosure, the two-phase immersion cooling device further includes a pressure balance valve, the pressure balance valve is disposed on the upper box body; when vapor pressure in the accommodating cavity is lower than an atmospheric pressure, the pressure balance valve is opened until the vapor pressure in the accommodating cavity equal to the atmospheric pressure.

According to an embodiment of the present disclosure, the plurality of heating elements includes a server applied to a data center, a battery or an electronic device applied to a new energy vehicle, an electronic chip or a device applied to a home intelligent digital appliance, an electronic chip or an electronic device applied to a digital medical treatment, an electronic chip or electronic device for digital medical treatment, a chip and an electronic device for edge computing, a chip for quantum computing, and a heating components applied to mechanical equipment or electronic equipment.

The upper box body of the two-phase immersion cooling device of the present disclosure does not need a cavity which allows the heating elements to pass through, so that the condenser with larger heat exchange surface area can be installed in the upper box body per unit volume, to meet higher cooling requirements. The upper box body and the lower box body are detachably connected, so that the heating elements can be directly replaced, assembled, repaired, and maintained in the lower box body.

DETAILED DESCRIPTION

The following description allows those skilled in the art to implement the present disclosure. The preferred embodiments in the following description are only examples, and those skilled in the art can think of other obvious variations. The basic principles of the present disclosure defined in the following description can be applied to other embodiments, modifications, improvements, equivalents, and other technical solutions that do not deviate from the spirit and scope of the present disclosure.

The embodiments of the present disclosure are described in combination with the accompanying drawings. Without conflict, the following embodiments and features in the embodiments may be combined or can replace each other.

Figure 1:
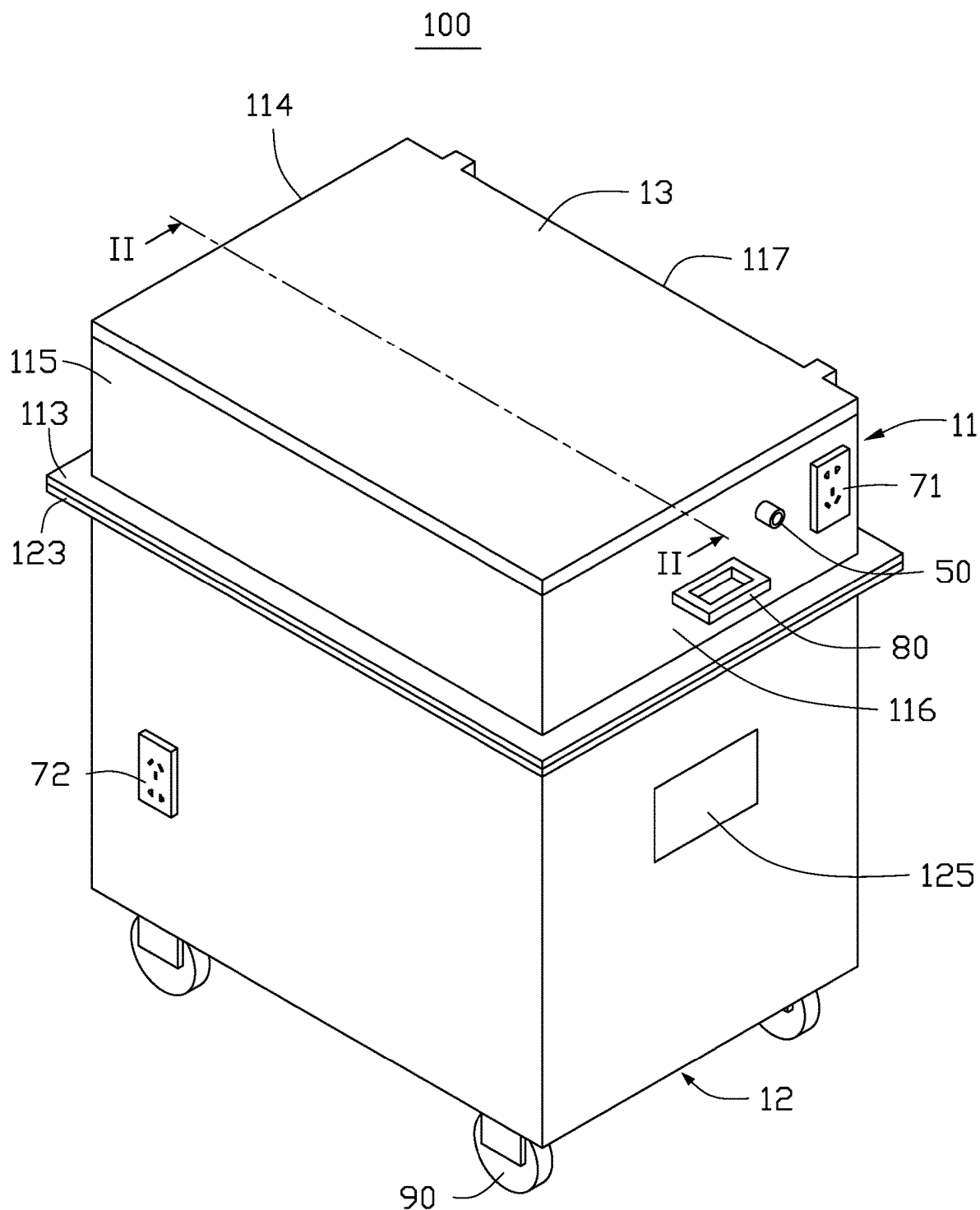
FIG. 1 is a schematic diagram of a two-phase immersion cooling device according to an embodiment of the present disclosure.
Figure 2:
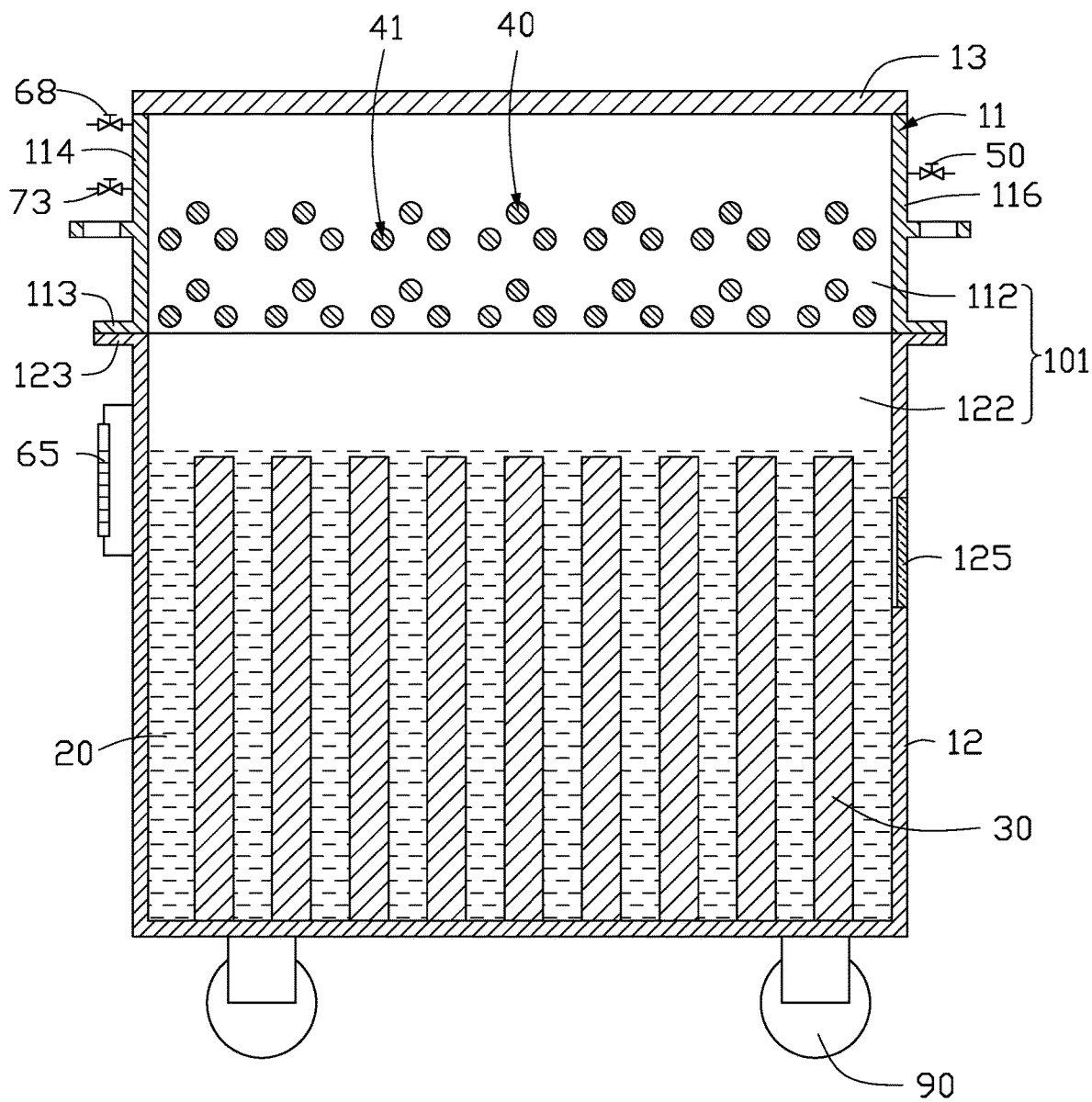
FIG. 2 is a sectional view along line II-II of FIG. 1.
Figure 3:
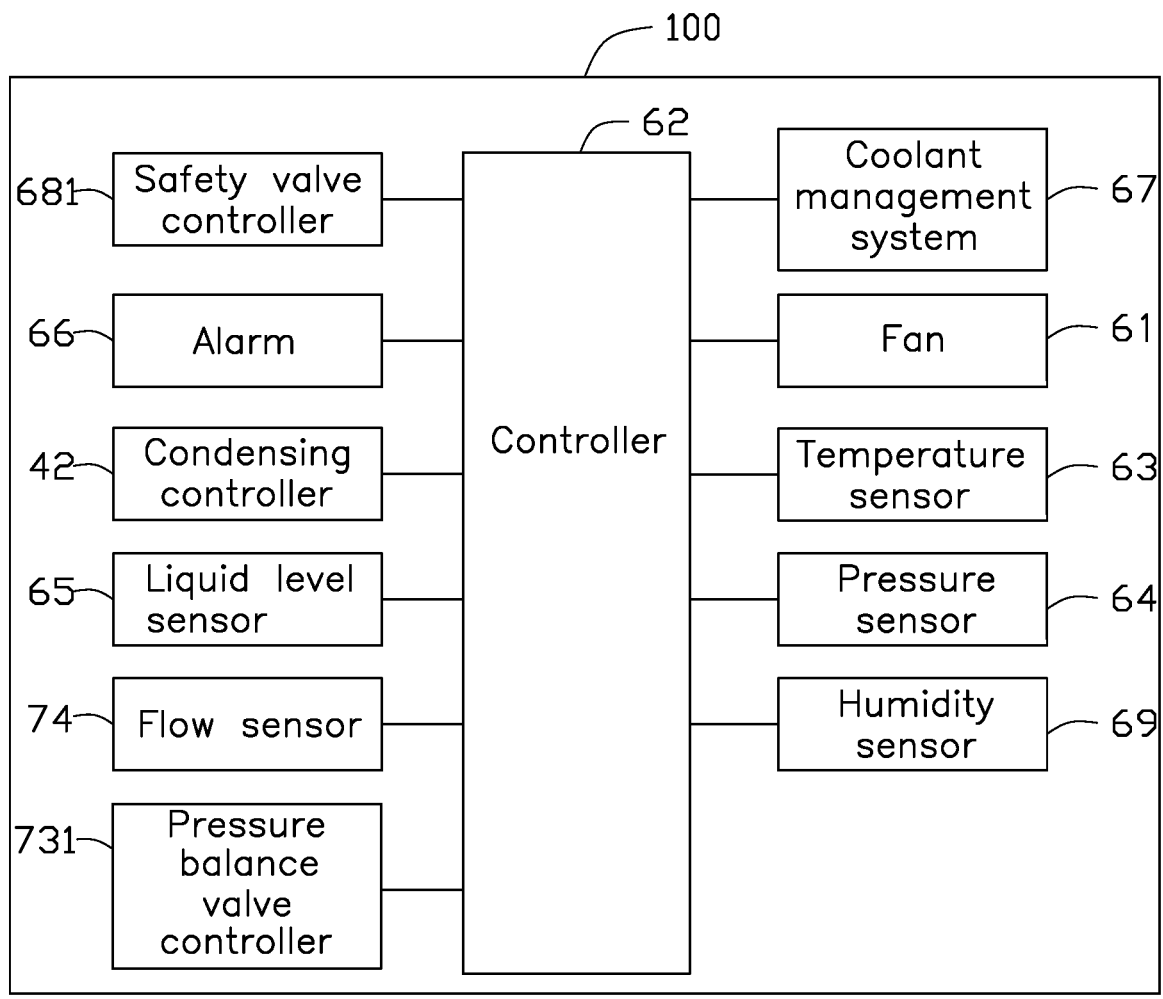
FIG. 3 is a schematic diagram of some components of the two-phase immersion cooling device according to an embodiment of the present disclosure.

FIG. 1 to FIG. 3 illustrate a two-phase immersion cooling device 100 in accordance with an embodiment of the present disclosure.

The two-phase immersion cooling device 100 includes an upper box body 11, a lower box body 12, a cover body 13, a coolant 20, a plurality of heating elements 30, and a condenser 40. The lower box body 12 is detachably and hermetically connected to a lower end of the upper box body 11. The lower box body 12 and the upper box body 11 form an accommodating cavity 101 together. The accommodating cavity 101 is used to contain the coolant 20, the heating elements 30, and the condenser 40. The cover body 13 is detachably connected to one end of the upper box body 11 away from the lower box body 12. The cover body 13 is adapted to cover the upper box body 11 to seal the accommodating cavity 101.

The upper box body 11 is roughly rectangular and cubic. Both ends of the upper box body 11 are provided with first openings (not shown), and the interior of the upper box body 11 is provided with a first cavity 112 connecting the two first openings. The upper box body 11 includes a first side wall 114, a second side wall 115, a third side wall 116, and a fourth side wall 117 connected to each other from top to bottom. The position of the first side wall 114 corresponds to the position of the third side wall 116, and the position of the second side wall 115 corresponds to the position of the fourth side wall 117. The first side wall 114, the second side wall 115, the third side wall 116, and the fourth side wall 117 jointly form the first cavity 112.

The lower box body 12 is roughly rectangular and cubic. Both ends of the lower box body 12 are respectively provided with second openings (not shown), and the interior of the lower box body 12 is provided with a second cavity 122 connecting the two second openings. When the upper box body 11 is installed at the upper end of the lower box body 12, the second cavity 122 is connected to the first cavity 112 and together form the accommodating cavity 101. The cover body 13 covers the opening of the upper box body 11 away from the lower box body 12, so that the accommodating cavity 101 becomes a closed cavity. The upper box body 11 can be detachably connected to the cover body 13 or the lower box body 12 by means of flange connection, hook connection, bite joint connection, clamp connection, or screw connection.

A first connecting portion 113 is formed on the outer wall of the bottom end of the upper box body 11. The first connecting portion 113 is disposed around the periphery of the upper box body 11, and the surface of the first connecting portion 113 facing the lower box body 12 is flush with the lower bottom surface of the upper box body 11. A second connecting portion 123 is formed on the outer wall of the top end of the lower box body 12. The second connecting portion 123 is arranged around the periphery of the lower box body 12, and the bottom surface of the second connecting portion 123 facing the upper box body 11 is flush with the top surface of the lower box body 12. In some embodiments, when the upper box body 11 is assembled on the lower box body 12, the surface of the first connecting portion 113 facing the lower box body 12 and the bottom surface of the second connecting portion 123 facing the upper box body 11 fit very closely to seal the accommodating cavity 101. In the embodiment, the first connecting portion 113 is detachably and hermetically connected to the second connecting portion 123.

The heating elements 30 can be, but are not limited to, a server and components applied in a data center, a battery and an electronic device of a new energy vehicle, an electronic chip and device of a home intelligent digital appliance, an electronic chip and an electronic device applied to digital medical treatment, a chip and an electronic device of edge computing, a chip of quantum computing, a chip of a robot, heat-generating components of a mechanical equipment or an electronic equipment. The present disclosure is not limited to the type, quantity, size, or scale of the heating element 30.

The coolant 20 may be, but is not limited to, a non-conductive liquid having low boiling point. The low boiling point here may be, for example, between about 40-70 degrees or lower than the temperature of the heat generated during the operation of the heating elements 30, in other words, the coolant 20 is a substance suitable for direct contact with the heating elements 30 and can effectively absorb all the heat generated by the heating elements 30 and boil and evaporate as a result. The present disclosure is not limited to the coolant 20 and its types and physical characteristics. The coolant 20 boils and gasifies rapidly in absorbing the heat generated by the heating element 30 and so reduces the temperature of the heating elements 30.

The condenser 40 is disposed in the first cavity 112. In the embodiment, the condenser 40 includes multiple rows and columns of condensing tubes 41, the rows and columns are disposed from the first side wall 114 to the third side wall 116, so that the condenser 40 fills the first cavity 112 in the length direction of the upper box body 11. Alternatively, the rows and columns are arranged from the second side wall 115 to the fourth side wall 117, so that the condenser 40 fills the first cavity 112 in the width direction of the upper box body 11. The rows and columns of condensing tubes 41 are disposed upward from the bottom of the upper box body 11, so that the condenser 40 fills the first cavity 112 in the height direction of the upper box body 11. When the coolant 20 absorbs the heat emitted by the heating elements 30 and is gasified, the heating element 30 itself is cooled, and the gaseous coolant flows upward to the condenser 40 in the closed accommodating cavity 101 and condenses on the condenser 40. The condensate is fallen back into the coolant 20 by gravity, and the cycle is repeated to keep the heating elements 30 cool.

The two-phase immersion cooling device 100 further includes a plurality of fan 61. The fan 61 is disposed in the accommodating cavity 101 above or below the condenser 40. The fan 61 force the gaseous coolant generated in the lower box body through the condenser with forced convection to strengthen condensation heat transfer. The fan 61 can be started when the heating elements 30 starts to operate and can be closed after the heating elements 30 stops operating.

The two-phase immersion cooling device 100 further includes a controller 62, a plurality of temperature sensors 63, a humidity sensor 69, a plurality of pressure sensors 64, a flow sensor 74, a liquid level sensor 65, an alarm 66, a coolant management system 67, a condensing controller 42, a pressure balance valve controller 731, and a safety valve controller 681.

Part of the temperature sensor 63, the humidity sensor 69, and the pressure sensor 64 are disposed in the accommodating cavity 101 and respectively used to sense the vapor, liquid temperature, vapor humidity, and vapor pressure at different positions in the accommodating cavity 101. The controller 62 is electrically connected to the fan 61, the temperature sensors 63, the humidity sensor 69, the pressure sensors 64, the flow sensor 74, the liquid level sensor 65, the alarm 66, the coolant management system 67, the safety valve controller 681, the pressure balance valve controller 731, and the condensing controller 42. The controller 62 can determine whether there is gaseous coolant in the accommodating cavity 101 according to at least one vapor and liquid temperature sensed by the temperature sensors 63, and the vapor pressure sensed by the pressure sensor 64, and it is used to control whether the fan 61 are started or not. When the vapor temperature sensed by the temperature sensor 63 is higher than a preset temperature, or the humidity sensed by the humidity sensor 69 is higher than a preset humidity, or the vapor pressure sensed by the pressure sensor 64 is higher than a preset pressure, the controller 62 controls the fan 61 to start operating.

The controller 62 is also used to control the condensing capacity of the condenser 40 by controlling the flow rate and inlet temperature of the coolant in the condenser 40 through the condenser controller 42. The controller 62 is also used to control the electrical connection of the coolant management system 67 to replenish the accommodating cavity 101 with coolant or to filter the coolant.

The safety valve 68 is arranged on the upper box body 11 and is electrically connected to the controller 62 through the safety valve controller 681. When the vapor pressure in the accommodating cavity 101 is higher than the preset pressure, the controller 62 controls the safety valve 68 to open until the vapor pressure in the accommodating cavity 101 is lower than the preset pressure, so as to maintain a safe pressure in the box body.

The liquid level sensor 65 is disposed on the side wall of the lower box body 12, and the liquid level sensor 65 is used to detect the liquid level of the coolant 20. The liquid level sensor 65 is connected to the accommodating cavity 101 using the communicator principle. The liquid level of the coolant 20 in the accommodating cavity 101 can be known by observing the liquid level of the liquid level sensor 65.

The controller 62 can control whether the alarm 66 is activated according to the liquid level of the coolant 20 detected by the liquid level sensor 65. When the liquid level detected by the liquid level sensor 65 is lower than the preset height, the controller 62 controls the alarm 66 to give an alarm and controls the coolant management system 67 to replenish the accommodating cavity 101 with coolant.

Figure 4:
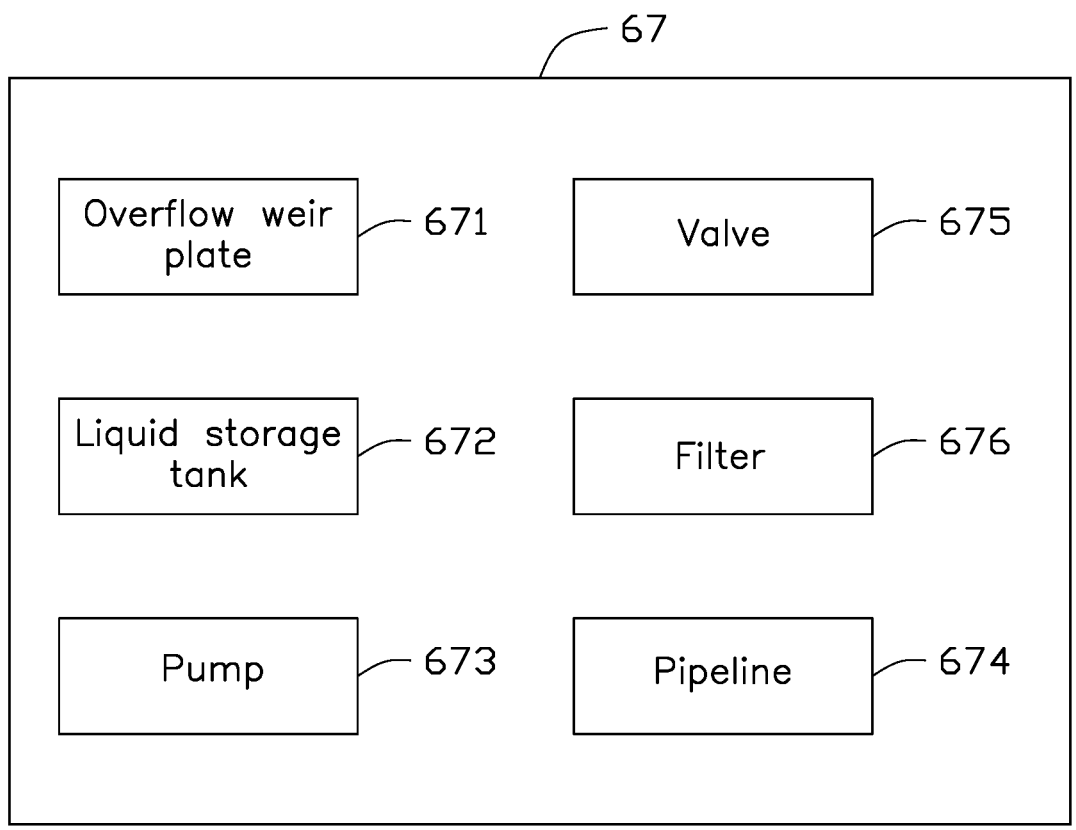
FIG. 4 is a schematic diagram of a coolant management system according to an embodiment of the present disclosure.

Referring to FIG. 4, the coolant management system 67 includes an overflow weir plate 671, a liquid storage tank 672, a pump 673, a pipeline 674, a valve 675, and a filter 676. The liquid storage tank 672 is separated from the coolant tank by an overflow weir plate 671 at the bottom of the accommodating cavity 101. The pump 673, the pipeline 674, the valve 675, and the filter 676 are in communication with the accommodating cavity 101 outside or inside the box body. When the liquid level of the coolant 20 in the accommodating cavity 101 is lower than a preset height, the controller 62 controls the pump 673 and valve 675 to open, and the coolant 20 can be pumped from the liquid storage tank 672 to the coolant tank at the bottom of the accommodating cavity 101, to keep the coolant level constant, and the pumped coolant flows through the upper end of the overflow weir plate 671 into the liquid storage tank 672, to keep the coolant level constant.

It can be understood that the number of the fan 61, the temperature sensors 63, the humidity sensor 69, the pressure sensor 64, the flow sensor 74, the liquid level sensor 65, the alarm 66, the coolant management system 67, the safety valve 68, the pressure balance valve 73, and the condenser 40 are all adjustable according to actual needs, the numbers can be 1-24, etc.

The two-phase immersion cooling device 100 further includes at least one first double-faced socket 71 and at least one second double-faced socket 72. The first double-faced socket 71 is disposed on the side wall of the upper box body 11. The inner socket of the first double-faced socket 71 is exposed to the first cavity, for electrical connection with the fan 61, the temperature sensors 63, the humidity sensor 69, the pressure sensors 64 disposed on the upper box body 11, and the outer socket of the first double-faced socket 71 is exposed to the outside the upper box body 11, and is used to electrically connected to the external connecting lines of the external power supply, the temperature sensors, the humidity sensor, the pressure sensors, the liquid level sensor, and the fan 61. The second double-faced socket 72 is arranged on the side wall of the lower box body 12. The inner socket of the second double-faced socket 72 is exposed to the second cavity for electrical connection with the heating elements, the liquid level sensor, the vapor temperature sensor, the liquid temperature sensor and the vapor humidity sensor, and the liquid level management system. The outer socket of the second double-faced socket 72 is exposed to the outside the lower box body 12, for electrical connection with the external connecting lines of the heating elements, the liquid level management system and the liquid level sensor. The first double-faced socket 71 and the second double-faced socket 72 are hermetically connected to the upper box body 11 and the lower box body 12 respectively to seal the box body.

The two-phase immersion cooling device 100 also includes a handle 80, and the handle 80 is disposed on the upper box body 11, giving a user a handhold when moving the upper box body 11.

The two-phase immersion cooling device 100 further includes a supporting member 90, the supporting member 90 is disposed on the bottom of the lower box body 12, to support the lower box body 12. The supporting member 90 may be, but is not limited to, a supporting frame to stabilize the lower box body 12, or a roller to facilitate the movement of the lower box body 12.

The two-phase immersion cooling device 100 further includes a liquid level window 125, and the liquid level window 125 is disposed on the lower box body 12. The operating state of the heating elements 30 and the liquid level height of the coolant 20 can be observed through the liquid level window 125.

The two-phase immersion cooling device 100 further includes an extracting valve 50, and the extracting valve 50 is disposed on the upper box body 11.

Before the heating element 30 starts to operate, the vacuum pump is used to extract the air or other non-condensable vapor in the accommodating cavity 101 through the extracting valve 50, so as to ensure the efficient condensation and heat transfer operation in the accommodating cavity 101.

The two-phase immersion cooling device 100 further includes a pressure balance valve 73. The pressure balance valve 73 is disposed on the upper box body 11. The pressure balance valve 73 is electrically connected to the controller 62 through the pressure balance valve controller 731. When the vapor pressure in the accommodating cavity 101 is lower than the atmospheric pressure, in order to facilitate the opening of the cover body, the pressure balance valve 73 can be opened manually or through the controller 62 to make the vapor pressure in the accommodating cavity equal to the atmospheric pressure.

When the user intends to replace, take, assemble, or repair the heating element 30 in the second cavity, then disconnect the connection between the upper box body 11 and the lower box body 12, and remove the upper box body 11 or the lower box body 12. Thus, the heating element 30 can be replaced, taken, assembled, or maintained directly through the second cavity 122.

Compared with the two-phase immersion cooling device with a cavity for the heating elements to pass through in the prior art, the upper box body 11 of the two-phase immersion cooling device 100 of the present disclosure does not need to reserve a cavity for the heating elements 30 to pass through, so that condenser 40 with larger heat exchange surface area can be installed in the upper box body 11 per unit volume, to meet greater cooling requirements. The upper box body 11 and the lower box body 12 are detachably connected, so that the heating elements 30 can be directly replaced, assembled, repaired, and maintained in the lower box body 12. For example, for an upper box with a volume of 1.4 m*0.75 m*0.3 m, if a cavity for the heating elements to pass through was to be reserved, the upper box body 11 could only accommodate a condenser with a heat transfer surface of 23 square meters. If no cavity is reserved for the heating elements to pass through, the entire first cavity 112 of the upper box body 11 can be occupied by the condenser 40. Then, the condenser with an additional 65 square meters of heat transfer surface can be accommodated in the upper box body 11, which is approximately 2.83 times of the heat transfer area of the condenser with a reserved cavity in the upper box body. That is, under the same size of the upper box body, compared with the condensing device with a cavity reserved in the upper box body for the heating elements to pass through, the condensing device filled with condenser in the upper box body can transfer approximately 2.82 times more heat. If the cooling device with a cavity reserved in the upper box body for the heating elements to pass through could cool the heat of 100 KW heating elements, the upper box body could cool the heat of 382 KW heating elements after it is filled with the condenser of the disclosure.

The two-phase immersion cooling device 100 provided by the present disclosure makes full use of the hollow volume of the upper box body 11, increases the heat exchange area of the condenser 40 per unit volume and improves the heat dissipation capacity. It can effectively take away high-density heat generated by the heating elements 30, and it can meet greater cooling demands of the heating elements 30. The overall size and floor space are reduced, the space utilization rate is improved, the cost is reduced, and the demand for miniaturization of two-phase immersion cooling device is met.

Those skilled in the art can understand that the above embodiments are only examples, in which the features of different embodiments can be combined with each other to obtain implementations that are easily conceivable according to the disclosure of the present disclosure but are not clearly indicated in the drawings.

Those skilled in the art should understand that the above description and the embodiments of the present disclosure shown in the drawings are only examples and do not limit the present disclosure. The purpose of the present disclosure has been completely and effectively achieved. The functions and structural principles of the present disclosure have been shown and explained in the embodiments. Without departing from the principles, the implementation of the present disclosure may have any deformation or modification.

What is claimed is:

1. A two-phase immersion cooling device comprising:
an upper box body, a lower box body, heating elements and a condenser, the upper box body comprising a first side wall, a second side wall, a third side wall and a fourth side wall that are connected to each other from top to bottom; the first side wall, the second side wall, the third side wall and the fourth side wall jointly form a first cavity; the lower box body defining a second cavity; the second cavity is configured to contain coolant; a plurality of heating elements are disposed in the second cavity and immersing in the coolant; and the condenser comprising multiple rows and multiple columns of condensing tubes; wherein each rows and each columns of the condensing tubes are arranged from the first side wall to the third side wall or from the second side wall to the fourth side wall, and upward from bottom of the upper box body to fill the first cavity;
and wherein the lower box body is detachably and hermetically connected to the bottom of the upper box body, an accommodating cavity is defined by the second cavity with the first cavity when the lower box body is connected to the upper box body;
wherein the two-phase immersion cooling device further comprises a controller and a coolant management system, when a liquid level height of the coolant detected by a liquid level sensor is lower than a preset height, the controller controls the coolant management system to replenish the coolant into the accommodating cavity;
wherein: the two-phase immersion cooling device further comprises, the controller is electrically connected to the liquid level sensor, an alarm, at least one condensing controller, at least one temperature sensor, at least one pressure sensor, at least one humidity sensor, at least one flow sensor, at least one fan, at least one safety valve controller, at least one pressure balance valve controller, and the coolant management system; and wherein when the liquid level height of the coolant detected by the liquid level sensor is lower than the preset height, the controller controls the alarm to output an alarm; and
wherein: the coolant management system comprises an overflow weir plate, a liquid storage tank, a pump, a pipeline, a valve, and a filter, the pump, the pipeline, the valve, and the filter are in communication with the accommodating cavity outside or inside the lower box body.

2. The two-phase immersion cooling device according to claim 1, wherein: the two-phase immersion cooling device further comprises the fan, the fan is disposed in the accommodating cavity and is located above or below the condenser.

3. The two-phase immersion cooling device according to claim 1, wherein: the two-phase immersion cooling device further comprises at least one sensor disposed in the accommodating cavity, the at least one sensor comprises at least one of the temperature sensor, the humidity sensor, the pressure sensor and the liquid level sensor;
at least one sensor is configured to sense at least one of a vapor temperature, liquid temperature, vapor humidity, vapor pressure, liquid level height of the coolant, inlet temperature and outlet temperature and flow rate of condenser coolant in the accommodating cavity.

4. The two-phase immersion cooling device according to claim 1, wherein: the two-phase immersion cooling device further comprises a first double-faced socket hermetically arranged on the upper box body, an inner socket of the first double-faced socket comprises an electrical connection to be connected with the fan and at least one sensor, an external socket of the first double-faced socket comprises an electrical connection to be connected with external connecting lines of an external power supply, the fan and the at least one sensor.

5. The two-phase immersion cooling device according to claim 1, wherein: the liquid level sensor is disposed on the lower box body, and the liquid level sensor is connected to the accommodating cavity and configured for detecting the liquid level height of the coolant.

6. The two-phase immersion cooling device according to claim 1, wherein: the two-phase immersion cooling device further comprises a second double-faced socket hermetically arranged on the lower box body, an inner socket of the second double-faced socket comprises an electrical connection configured to be connected with the heating elements, temperature sensors, a liquid level management system, and the liquid level sensor, an external socket of the second double-faced socket comprises an electrical connection configured to be connected with external connecting lines of the heating elements, the temperature sensors, the liquid level management system and the liquid level sensor.

7. The two-phase immersion cooling device according to claim 1, wherein: the lower box body is detachably connected with the upper box body through a flange connection, a hook connection, a bite joint connection, a clamp connection or a screw connection.

8. The two-phase immersion cooling device according to claim 1, wherein:
the two-phase immersion cooling device further comprises a cover body, the cover body is detachably connected to one end of the upper box body away from the lower box body, and the cover body covers the upper box body to seal the accommodating cavity.

9. The two-phase immersion cooling device according to claim 1, wherein: the two-phase immersion cooling device further comprises an extracting valve disposed on the upper box body, the extracting valve is configured to be connected with a vacuum pump to extract non-condensable vapor in the accommodating cavity.

10. The two-phase immersion cooling device according to claim 1, wherein:

the upper box body comprises a safety valve, when a vapor pressure in the accommodating cavity is higher than a preset vapor pressure, the safety valve is opened until the vapor pressure in the accommodating cavity is lower than the preset vapor pressure.

11. The two-phase immersion cooling device according to claim 1, wherein:

the two-phase immersion cooling device further comprises a pressure balance valve, the pressure balance valve is disposed on the upper box body; when a vapor pressure in the accommodating cavity is lower than an atmospheric pressure, the pressure balance valve is opened until the vapor pressure in the accommodating cavity equals to the atmospheric pressure.

12. The two-phase immersion cooling device according to claim 1, wherein: the plurality of heating elements comprises a server applied to a data center, a battery or an electronic device applied to a new energy vehicle, an electronic chip or a device applied to a home intelligent digital appliance, an electronic chip or an electronic device applied to a digital medical treatment, an electronic chip or electronic device for digital medical treatment, a chip and an electronic device for edge computing, a chip for quantum computing.

* * * * *